(12) United States Patent
Minami et al.

(10) Patent No.: US 7,683,960 B2
(45) Date of Patent: Mar. 23, 2010

(54) DOUBLE-SEALED IMAGING APPARATUS

(75) Inventors: Itsuji Minami, Saitama (JP); Kazuaki Takahashi, Saitama (JP)

(73) Assignee: Fujinon Corporation, Saitama-shi (JP)

( * ) Notice: Subject to any disclaimer, the term of this patent is extended or adjusted under 35 U.S.C. 154(b) by 1163 days.

(21) Appl. No.: 10/806,239

(22) Filed: Mar. 23, 2004

(65) Prior Publication Data

US 2004/0188816 A1    Sep. 30, 2004

(30) Foreign Application Priority Data

Mar. 25, 2003    (JP)    ............................. 2003-082181

(51) Int. Cl.
*H04N 5/225*    (2006.01)
(52) U.S. Cl. ...................... 348/340; 348/374
(58) Field of Classification Search ................. 348/340, 348/335, 374; 257/294
See application file for complete search history.

(56) References Cited

U.S. PATENT DOCUMENTS

| | | | |
|---|---|---|---|
| 4,594,613 A * | 6/1986 | Shinbori et al. ............. | 348/340 |
| 6,040,612 A * | 3/2000 | Minami et al. .............. | 257/432 |
| 6,184,514 B1 * | 2/2001 | Rezende et al. .......... | 250/208.1 |
| 6,319,196 B1 * | 11/2001 | Minami ...................... | 600/130 |
| 7,138,695 B2 * | 11/2006 | Kim et al. .................... | 257/433 |

FOREIGN PATENT DOCUMENTS

| | | |
|---|---|---|
| JP | 09-018794 | 1/1997 |
| JP | 10-216083 | 8/1998 |

* cited by examiner

*Primary Examiner*—Justin P Misleh
(74) *Attorney, Agent, or Firm*—Birch, Stewart, Kolasch & Birch, LLP

(57) ABSTRACT

An imaging portion of an imaging apparatus according to the present invention has a cover glass adhered by an adhesive to an imaging surface side of a CCD in a state of sandwiching leads (adhesion area $B_1$), and has a slight airtight air gap formed on the imaging surface side of the CCD so as to render a circumference of the cover glass larger than the CCD. As for a circuit board, a concave portion for accommodating the CCD is formed, and a periphery of the cover glass is adhered to a top surface of the circuit board by the adhesive (adhesion area $B_2$). Thus, the air gap is doubly sealed so that its airtightness is improved and influence of temperature change is reduced so as to prevent condensation on a back side of the cover glass and so on.

2 Claims, 5 Drawing Sheets

FIG.1A
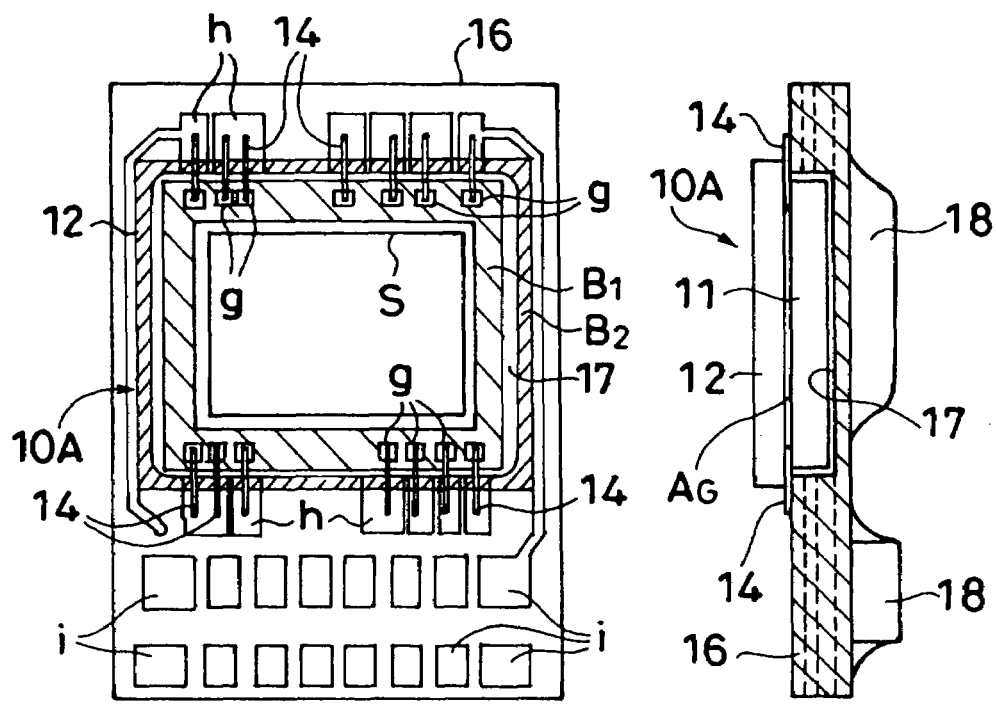
FIG.1B
FIG.1C
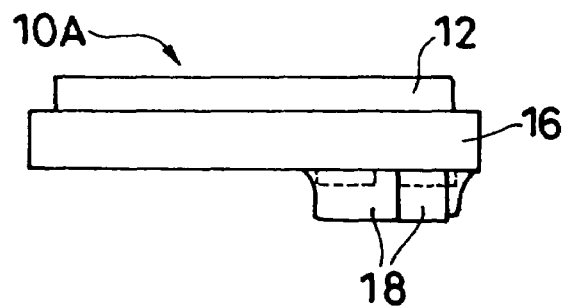

DOUBLE-SEALED IMAGING APPARATUS

BACKGROUND OF THE INVENTION

The application claims the priority of Japanese Patent Applications No. 2003-82181 filed on Mar. 25, 2003 which is incorporated herein by reference.

1. Field of the Invention

The present invention relates to an imaging apparatus, and more particularly, to the imaging apparatus to be mounted on an electronic endoscope or the like and having such a configuration that a slight air gap is formed between an imaging surface of a solid-state image pickup device and a cover glass.

2. Description of the Related Art

A CCD (Charge Coupled Device) and so on which are solid-state image pickup devices are provided at an end of an electronic endoscope, for instance, so as to image the inside of an observed body and a subject. In recent years, however, miniaturization of an imaging portion including the CCD is underway in conjunction with reduction in diameter of the electronic endoscopes and miniaturization of cameras.

FIGS. 7A to 7D show a configuration of an imaging apparatus according to Japanese Patent Laid-Open No. 10-216083 which is an example in the past. As shown in FIGS. 7A and 7B, the imaging apparatus uses an imaging portion (mounting element) 4 wherein a cover glass 3 is adhered to an imaging surface S side of a CCD 1 by an adhesive $b_1$ as if sandwiching leads 2 of a conductor. The imaging portion 4 is produced by a mass production method for performing an assembly mounting process and an inspection process of the CCD 1, leads 2 and cover glass 3 like an assembly-line operation, such as a TAB (Tape Automated Bonding) method. According to the imaging portion 4, a small air gap $A_G$ of 50 μm or so in an airtight state is formed between the imaging surface S of the CCD 1 and the cover glass 3.

The CCD 1 is placed in a through-hole 5A formed on a circuit board 5, and the leads 2 jutting out of the imaging portion 4 are connected to terminals on the circuit board 5 side. A circuit member 6 for processing an imaging signal is provided on aback side of the circuit board 5. Furthermore, as shown in FIGS. 7C and 7D, an adhesive $b_2$ is applied to the whole area of the circumference of the cover glass 3 and is filled in the through-hole 5A, which strengthens fixing of the imaging portion 4 and the circuit board 5 and also secures airtightness of the air gap $A_G$ between the imaging surface S of the CCD 1 and the cover glass 3. Such an imaging apparatus has the imaging signal obtained by the CCD 1 supplied to an image processing circuit via a signal line connected to an i terminal of the circuit board 5, and an image of an observed body is displayed on a monitor and so on based on the signal after image processing.

SUMMARY OF THE INVENTION

As shown in FIGS. 7A to 7D, however, the imaging apparatus in the past has a problem that, due to existence of moisture slightly remaining in the air gap $A_G$ in the airtight state between the CCD 1 and the cover glass 3 and the moisture seeping in from an adhered portion (seal portion) after implementation and change in ambient temperature, condensation occurs on a back side of the cover glass 3 and so on and a condensation form thereof is projected in an image. To be more specific, the above-mentioned circuit board 5 has a circuit member 6 as a heat generating portion provided thereon, and an electronic endoscope is heat-treated on cleaning and sterilization thereof. There is a tendency in recent years, however, that heat-treatment conditions thereof are becoming strict, and so the condensation occurs due to temperature change caused by existence of such a heat generating portion and heat-treatment.

Furthermore, the adhesive for maintaining airtightness in the air gap $A_G$ becomes weak against seepage of moisture with time, and in the configuration example in FIGS. 7A to 7D, the air gap $A_G$ is 50 μm or so which is extremely small and is apt to be affected by the moisture existing inside. Such various factors lead to occurrence of the condensation.

The present invention has been implemented in consideration of the above problem, and an object thereof is to provide the imaging apparatus which does not allow the condensation to occur on the back side of the cover glass and so on even in the case where the air gap between an imaging surface of a solid-state image pickup device and the cover glass is small.

To attain the object, the present invention is characterized in that it has an imaging portion in which the cover glass is adhered to the imaging surface side of the solid-state image pickup device as if sandwiching leads, a slight air (sealed) gap is formed between the cover glass and the imaging surface of the solid-state image pickup device and a circumference of the cover glass is larger than the solid-state image pickup device, and a circuit board having an accommodation concave portion for accommodating the solid-state image pickup device so as to connect the leads to terminals on an upper edge of the accommodation concave portion, and adheres the circumference of the cover glass to the circuit board in a state of sealing the accommodation concave portion.

According to the configuration, the cover glass is adhered to the imaging surface side of the solid-state image pickup device in the state of sandwiching the leads, and is also adhered to the circuit board in the state of having the solid-state image pickup device accommodated in the accommodation concave portion of the circuit board. Therefore, the air gap on the imaging surface is doubly sealed by double adhesion of the cover glass so that the seepage of the moisture is blocked well by improvement in the airtightness. In addition, an air layer existing inside the accommodation concave portion functions as a heat blocking layer for airtight space on the imaging surface, and so it well blocks the heat from the circuit member implemented on the circuit board or the heat from the outside on the heat-treatment of the apparatus itself such as the electronic endoscope.

It is possible, in the above invention, to provide on the circumference on the leads-placed side of the cover glass a projection projecting to the outside from a clearance of a part of the lead arrangement so as to adhere the periphery of the cover glass including the projection to the upper edge of the accommodation concave portion of the circuit board. Thus, the periphery (surrounding area) of the cover glass including the projection placed at a position avoiding the leads is adhered to the upper edge of the accommodation concave portion of the circuit board, and so there is an advantage that adhesion area can be increased to improve the effect of adhering to the circuit board and the airtightness. In this case, as the projection of the cover glass is formed by avoiding the leads, it is no obstacle to pressure bonding connection of the leads by a bump apparatus.

Another invention is characterized in that it has an imaging portion in which the cover glass is adhered to the imaging surface side of the solid-state image pickup device as if sandwiching leads, the slight air gap is formed between the cover glass and the imaging surface of the solid-state image pickup device and the circumference of the cover glass is larger than the solid-state image pickup device, and the circuit board having the accommodation concave portion for accommodating the solid-state image pickup device so as to connect the leads to terminals on the upper edge of the accommodation concave portion, and projects the circumference on the leads-placed side of the cover glass further than the leads and places an insulative elastic member between the cover glass and the leads so as to adhere the circumference of the cover glass to the circuit board and seal the accommodation concave portion while maintaining good electrical contact between the leads and the terminals on the circuit board side with the insulative elastic member.

According to the configuration, the cover glass large enough to cover the leads is adhered to the circuit board, where the leads contact the terminals on the circuit board side well due to the existence of the insulative elastic member. Therefore, in this case, electrical connections of the leads are well made at the same time as pressure adhesion of the cover glass and the circuit board, not by bump connections of individual leads.

BRIEF DESCRIPTION OF THE DRAWINGS

FIGS. 1A to 1C show a configuration of an imaging apparatus according to a first embodiment of the present invention, where FIG. 1A is a top view (seeing through a cover glass), FIG. 1B is a right side view in a state of having a circuit board cut, and FIG. 1C is a bottom side view;

FIG. 4A is a top view (seeing through the cover glass), FIG. 4B is a right side view in a state of having the circuit board cut, and FIG. 4C is a bottom side view;

FIG. 5A is a top view (seeing through the cover glass), and FIG. 5B is a right side view in the state of having the circuit board cut;

FIG. 7A is a top view, FIG. 7B is a side view, and FIG. 7C is a diagram in a state of having an adhesive applied to the apparatus in FIG. 7A, and FIG. 7D is a partially enlarged view of a side of FIG. 7C.

DETAILED DESCRIPTION OF THE PREFERRED EMBODIMENTS

First Embodiment

Figure 2:
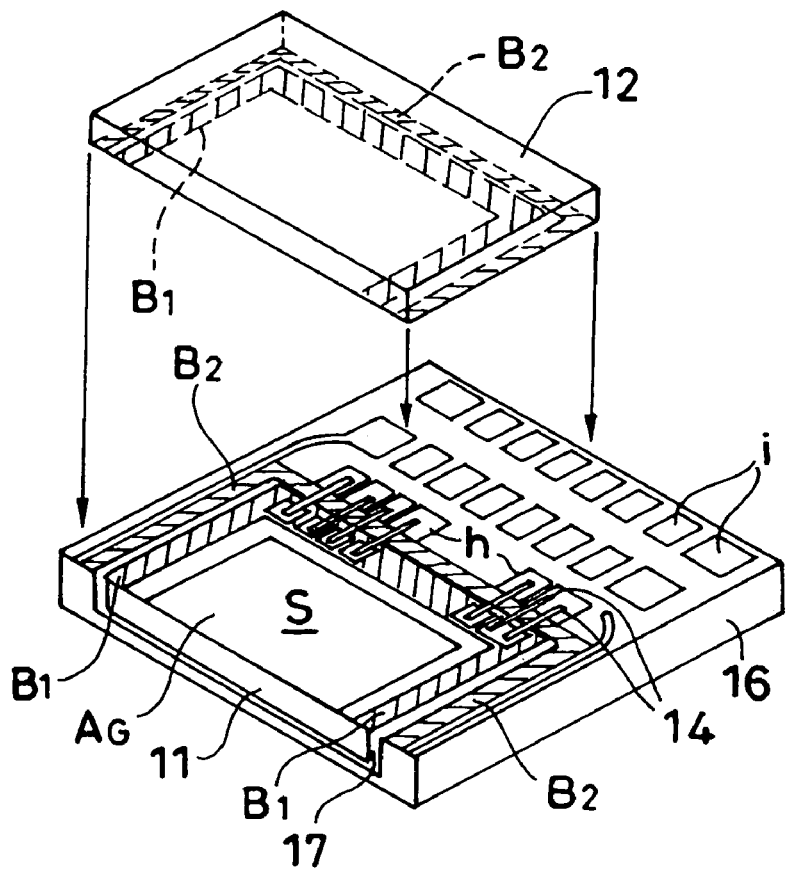
FIG. 2 is an exploded perspective view in a state of having the imaging apparatus of the first embodiment cut sideways in the middle and separating the cover glass.

FIGS. 1A to 1C show a configuration of an imaging apparatus according to a first embodiment, and FIG. 2 shows an exploded perspective view of a part of the imaging apparatus. These drawings are drawn in a state of seeing through a cover glass. An imaging portion 10A in FIGS. 1A to 1C is a mounting element wherein a cover glass 12 is mounted on a CCD (Charge Coupled Device) 11 which is a solid-state image pickup device as in FIGS. 7A to 7D, and is produced by a TAB (Tape Automated Bonding) method for instance. To be more specific, a conductor lead 14 is connected to each of a plurality of terminals g of the CCD 11, and the cover glass 12 is adhered to an imaging surface (S) side by inserting an adhesive (or a sealant) into a surrounding adhesion area (shaded area) $B_1$ avoiding the imaging surface S of the CCD 11. Consequently, an air gap (air layer) $A_G$ of 50 μm or so is formed between it and the cover glass 12 on the imaging surface side of the CCD 11. Nitrogen gas or the like is filled into the air gap $A_G$ in order to protect the imaging surface S.

The circumference (all sides) of the cover glass 12 is formed to be larger than that of the imaging surface side of the CCD 11 and in the size for blocking an entrance of an accommodation concave portion (17) of a circuit board described later (formed to be larger than the entrance dimension). A circuit board 16 is formed by laminating a plurality of ceramic sheets to form the concave portion 17 in a size capable of accommodating the CCD 11. It has terminals h for connecting leads 14 and terminals i for connecting signal lines and a power wire formed on its surface, and has a plurality of circuit members 18 for processing imaging signals from the CCD 11 mounted on its back side.

To mount the imaging portion 10A on the circuit board 16, the adhesive is applied to an adhesion area (shaded area) $B_2$ in the periphery (surrounding area) of the back side of the cover glass 12, for instance, and the cover glass 12 is adhered to the top surface (upper edge of the accommodation concave portion 17) of the circuit board 16, and the leads 14 are pressure-bonded to the terminals h thereafter by a bump apparatus or the like. It is also possible to insert the adhesive between the cover glass 12 and the circuit board 16 after connecting the leads 14.

FIG. 2 shows a state of having the imaging apparatus in FIG. 1 cut halfway and separating the cover glass 12. As is understood from FIG. 2, according to the first embodiment, the cover glass 12 is adhered to the CCD 11 by the adhesive in the adhesion area $B_1$ indicated in diagonal lines, and is adhered to the circuit board 16 in the adhesion area $B_2$ indicated in diagonal lines. Therefore, the air gap $A_G$ formed on the imaging surface side of the CCD 11 is doubly adhered and sealed.

Figure 7A:
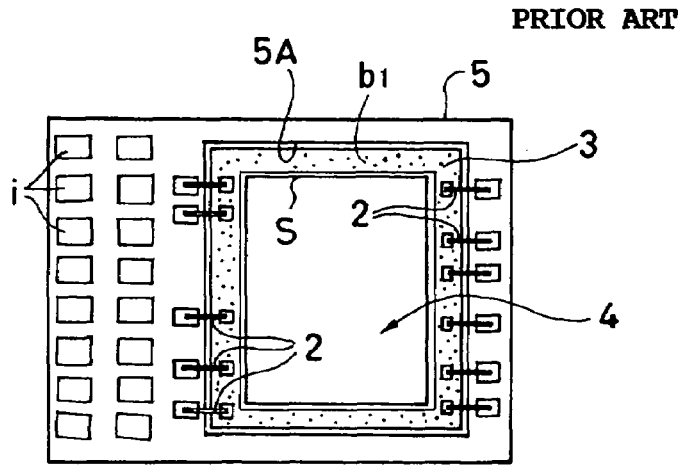
FIGS. 7A to 7D show the configuration of the imaging apparatus in the past (seeing through the cover glass), where
Figure 7B:
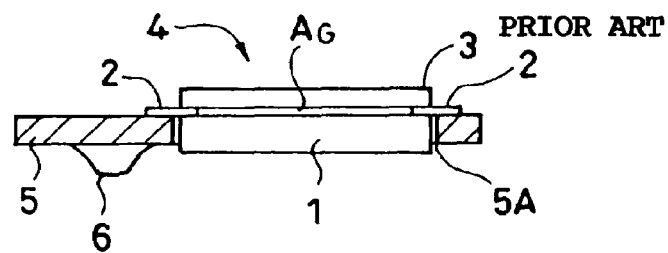
Figure 7C:
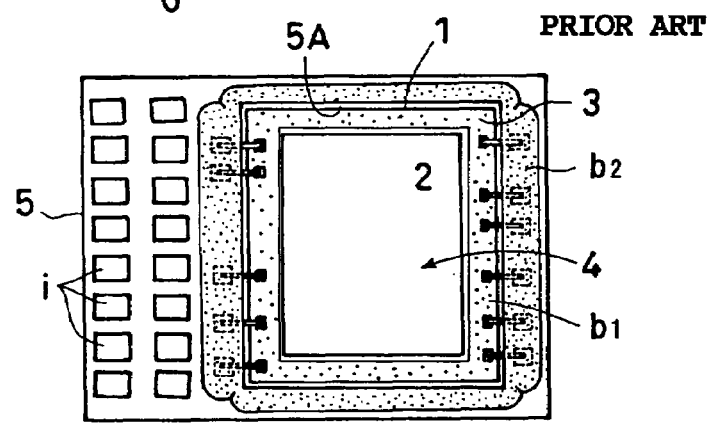
Figure 7D:
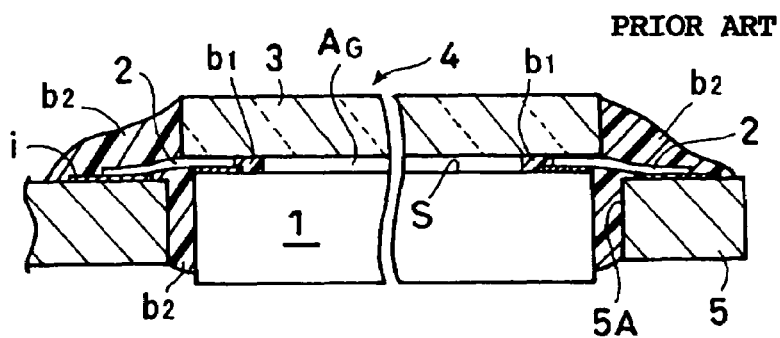

According to such a configuration of the first embodiment, airtightness in the air gap $A_G$ is conspicuously improved by a double bonded structure so that occurrence of condensation in the air gap $A_G$ is well curbed by preventing seepage of moisture. To be more specific, as shown in FIG. 7D, even the imaging apparatus in the past in FIG. 7 has not only an adhesive $b_1$ between a CCD (1) and a cover glass (3) but the adhesive $b_1$ is also filled and placed on the circumference of the cover glass (3) and in a through-hole (5A) of a circuit board (5). In general, however, the adhesive is weak against the seepage of moisture with time, and the moisture seeps into the air gap $A_G$ even if the adhesive $b_1$ is placed on the periphery or filled in relatively broad clearances. As opposed to this, seepage routes of the moisture up to the air gap $A_G$ in the embodiment are the adhesion area $B_2$ between the cover glass 12 and the circuit board 16, the clearance between the CCD 11 and the circuit board 16 (concave portion 17), and the adhesion area $B_1$ between the cover glass 12 and the CCD 11, where the distances are longer (closed nature is higher) than in the past so that the seepage of moisture is less likely to occur. The clearance between the CCD 11 and the circuit board 16 in the seepage routes is buffer space of the moisture against the air gap $A_G$.

Furthermore, the air layer between the CCD 11 and the circuit board 16 (concave portion 17) functions as a heat blocking layer for the air gap $A_G$. To be more specific, heat is generated from the circuit member 18 mounted on the back side of the circuit board 16 during operation and the heat is given from the outside on the heat-treatment of the apparatus itself such as the electronic endoscope. However, the existence of the air layer curbs influence of the temperature change due to the heat on the air gap $A_G$. Consequently, it prevents the condensation on the back side of the cover glass 12 and so on including influence of degradation of the adhesive.

Second Embodiment

Figure 3:
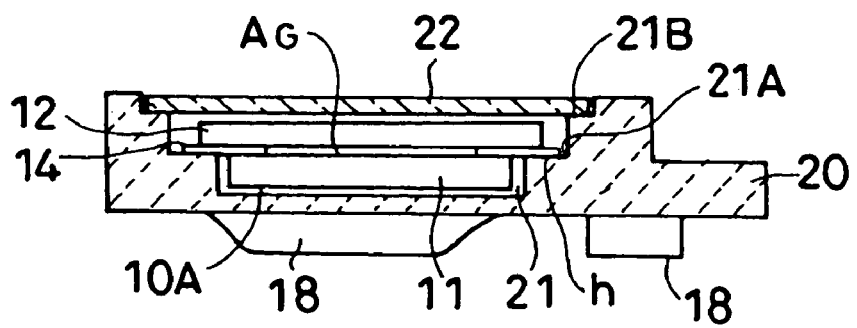
FIG. 3 is a right side view showing the configuration of the imaging apparatus according to a second embodiment in a state of having the circuit board and an outer cover glass cut.

FIG. 3 shows the configuration of a second embodiment having the cover glass doubled. According to the second embodiment, the imaging portion 10A is provided as in the first embodiment, and a concave portion 21 of the size capable of accommodating the entire imaging portion 10A is formed on a circuit board 20 in FIG. 3. The concave portion 21 has terminals h provided in a first level portion 21A, and the leads 14 of the imaging portion 10A are connected to the terminals h. In this case, the adhesion area ($B_2$) is adhered by the adhesive as in the first embodiment. And an outer cover glass 22 as a separate body is adhered to a second level portion 21B of the concave portion 21 by the adhesive, and thus the space from and above the first level portion 21A becomes sealed.

According to such a second embodiment, the inside of the air gap $A_G$ is doubly sealed by the cover glass 12, and it becomes a double cover-glass structure with the cover glasses 12 and 22. The double cover-glass structure has an advantage that it can enhance the effect of blocking the heat from outside the cover glasses 12 and 22.

Third Embodiment

Figure 4A:
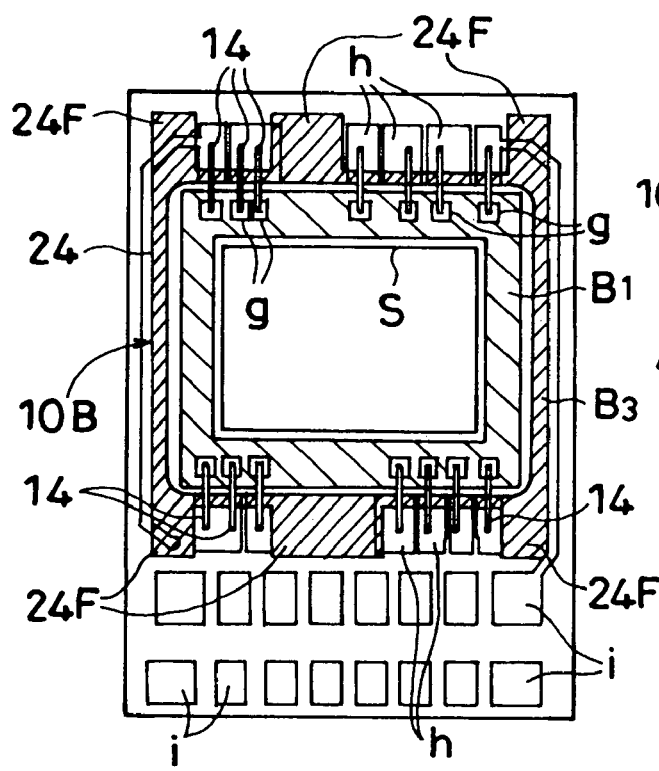
FIGS. 4A to 4C show the configuration of the imaging apparatus according to a third embodiment, where
Figure 4B:
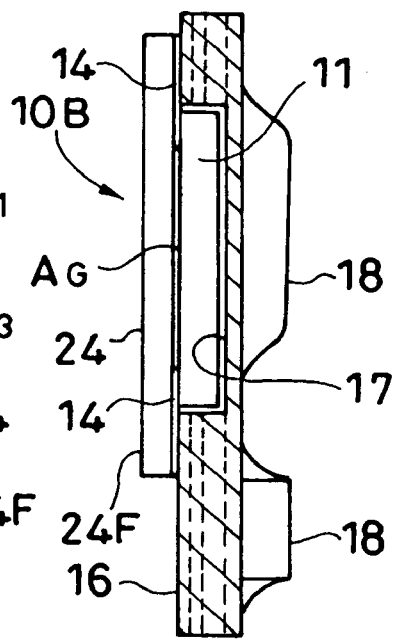
Figure 4C:
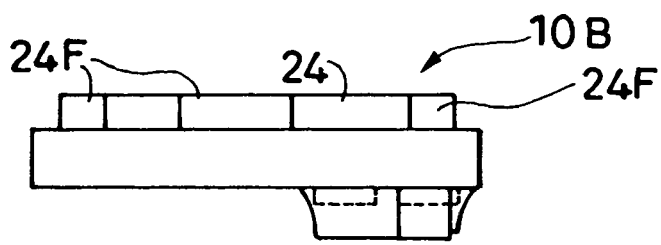

FIGS. 4A to 4C show the configuration of a third embodiment for increasing adhesion area of the cover glass and the circuit board. According to the third embodiment, the circuit board 16 used in the first embodiment is provided, and the configuration other than a cover glass 24 is the same in an imaging portion 10B. As shown in FIG. 4A, the cover glass 24 has its side portion on the leads-placed side (side portion on the vertical side in FIG. 4A) projected outward from the side portion position in the first embodiment (projected further than the length of the leads 14), where projection portions 24F on both ends and the projection portions 24F in the clearances with no lead 14 arrangement are formed. From another viewpoint, the third embodiment has rendered the leads-placed side of the cover glass 24 larger than the length of the leads 14 and notched the placement portion of the leads 14. And the periphery (surrounding area) of the cover glass 24 including the projection 24F is adhered by the adhesive to the top surface (upper edge of the concave portion 17) of the circuit board 16 in an adhesion area $B_3$ shown in FIG. 4A. The leads 14 can be connected to the terminals h by inserting a connection tool such as a bump apparatus from the space between the projections 24F.

According to such a third embodiment, the adhesion area increases by the area of the projections 24F in the adhesion area $B_3$ of the cover glass 24 in comparison with the first embodiment, and there is an advantage that the airtightness in the concave portion 17 and thus the airtightness in the air gap $A_G$ can be improved.

Fourth Embodiment

Figure 5A:
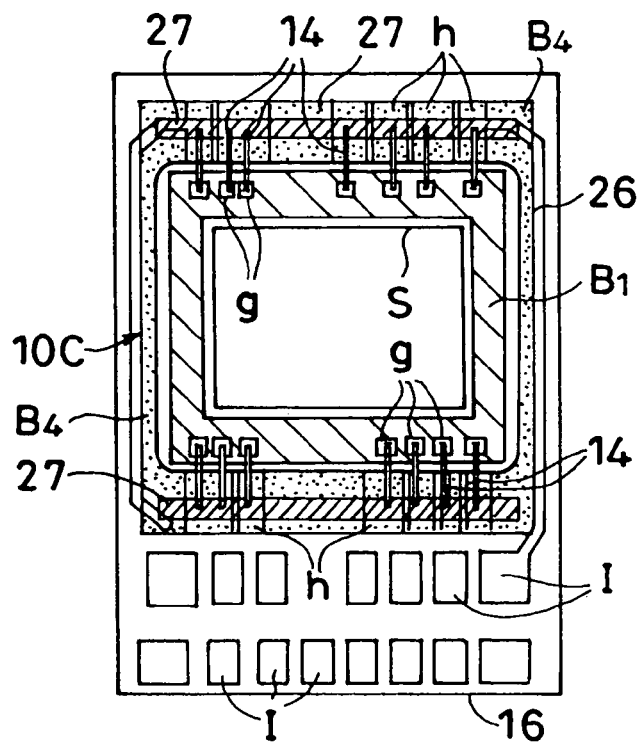
FIGS. 5A and 5B show the configuration of the imaging apparatus according to a fourth embodiment, where
Figure 5B:
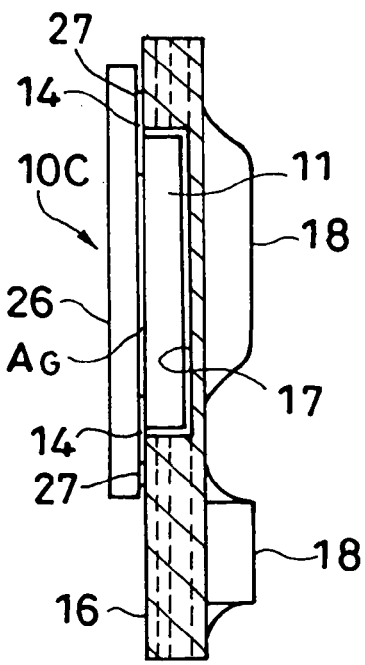

FIGS. 5A and 5B show the configuration of a fourth embodiment for increasing the adhesion area of the cover glass and the circuit board. According to the fourth embodiment, the circuit board 16 used in the first embodiment is provided, and the configuration other than a cover glass 26 and an elastic member 27 is the same in an imaging portion 10C. As shown in FIGS. 5A and 5B, the cover glass 26 has a size (square) having its side portion on the leads-placed side projected further outward than the leads 14. And as indicated by the diagonal lines in FIGS. 5A and 6, a sheet-like insulative elastic member 27 is adhered and placed on the lead end side between the cover glass 26 and the leads 14. A rubber member, a synthetic-resin member, a spongy member or the like is used for the elastic member 27.

Figure 6:
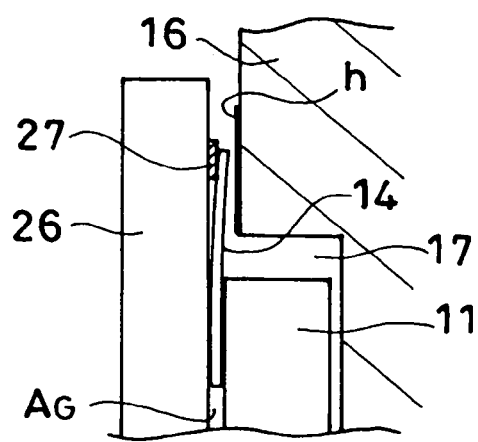
FIG. 6 is an enlarged side view of an upside portion of FIG. 5B showing a state of the imaging apparatus of the fourth embodiment before adhering the cover glass.

And as shown in FIG. 5A, the periphery of the cover glass 26 is adhered to the top surface (upper edge of the concave portion 17) of the circuit board 16 in an adhesion area $B_4$ (dotted portion), and the leads 14 are electrically connected to the terminals h at the same time. To be more specific, as shown in FIG. 6, the leads 14 before the adhesion are slightly floating from the cover glass 26. When the cover glass 26 is adhered to the circuit board 16, the leads 14 contact the terminals h first. Therefore, electrical contact between the leads 14 and the terminals h is well maintained even in the case of adhering them by applying the adhesive (applying it to those other than the leads 14).

According to such a fourth embodiment, the adhesion area significantly increases in comparison with the first and second embodiments so as to further improve the airtightness in the concave portion 17 and thus the airtightness in the air gap $A_G$. It also has an advantage that electrical connections between the leads 14 and the terminals h on the circuit board 16 side can be well made by pressure-bonding with the adhesive instead of using the bump apparatus.

As described above, according to the present invention, the air gap on the imaging surface of the solid-state image pickup device is doubly sealed so that the seepage of the moisture is blocked well by improvement in the airtightness and closed nature. Consequently, it prevents the condensation on the back side of the cover glass and so on. The air layer existing inside the accommodation concave portion functions as a heat blocking layer for the air gap, and it blocks the heat from the circuit member and the heat on the heat-treatment of the apparatus itself so as to securely prevent the condensation.

It is also possible to have the side portion on the leads-placed side of the cover glass projected and adhere the periphery of the cover glass including the projection to the upper edge of the accommodation concave portion of the circuit board so as to increase the adhesion area and thereby improve the effect of adhering to the circuit board and thus the airtightness of the air gap.

Furthermore, it is possible, by rendering the cover glass large enough to cover the leads and placing the insulative elastic member between the cover glass and the leads, to increase the adhesion area and thereby improve the airtightness of the air gap and have the leads contact the terminals on the circuit board side well on adhering the cover glass to the circuit board so as to make electrical connections of the leads well by pressure adhesion of the cover glass and the circuit board instead of bump connections of individual leads.

What is claimed is:
1. An imaging apparatus comprising:
   an imaging portion in which a cover glass is adhered to an imaging surface side of a solid-state image pickup device as if sandwiching leads, a slight first air gap is formed between the cover glass and the imaging surface of the solid-state image pickup device and a circumference of the cover glass is larger than the solid-state image pickup device, and
   a circuit board having an accommodation concave portion for accommodating the solid-state image pickup device so as to connect the leads to terminals on an upper edge of the accommodation concave portion, wherein the concave portion forms a second air gap between a first adhesion area and a second adhesion area, and the second air gap is formed between the solid-state image pickup device and the circuit board in the concave portion, and the first air gap and the second air gap are airtight spaces respectively, the first adhesion area being between the solid state image sensor and the cover glass, and the second adhesion area being between the cover glass and the circuit board, wherein the first adhesion area and the second adhesion area are on a same side of the cover glass, and wherein said cover glass is formed in a size for blocking an entrance of said accommodation concave portion;

wherein the adhesion area between the cover glass and the circuit board adheres to the circuit board in a state of sealing the accommodation concave portion.

2. The imaging apparatus according to claim 1, wherein said first adhesion is between an edge of the solid state image sensor and the cover glass, the second adhesion area is between the cover glass and an edge of the circuit board which is adjacent to said edge of the solid state image sensor, and the second air gap is formed between said edge of the solid state image sensor and said edge of the circuit board.

* * * * *